United States Patent [19]
Shurtliff

[11] Patent Number: 5,975,094
[45] Date of Patent: Nov. 2, 1999

[54] METHOD AND APPARATUS FOR ENHANCED CLEANING OF A WORKPIECE WITH MECHANICAL ENERGY

[75] Inventor: Eric C. Shurtliff, Phoenix, Ariz.

[73] Assignee: Speedfam Corporation, Chandler, Ark.

[21] Appl. No.: 08/979,098

[22] Filed: Nov. 26, 1997

[51] Int. Cl.$^6$ ........................................................ B08B 3/12
[52] U.S. Cl. .............................. 134/1.3; 15/77; 15/88.3; 15/102; 134/6
[58] Field of Search .............................. 15/21.1, 77, 88.2, 15/88.3, 94, 102, 103.5; 134/1.3, 6, 7, 69 R, 122 R, 184, 902

[56] References Cited

U.S. PATENT DOCUMENTS

| | | | |
|---|---|---|---|
| 3,635,762 | 1/1972 | Ott et al. ........................................ | 15/94 |
| 4,129,919 | 12/1978 | Fitch et al. .................................. | 15/102 |
| 4,475,259 | 10/1984 | Ishii et al. .................................... | 15/77 |
| 5,138,733 | 8/1992 | Bock ........................................ | 15/22.1 |
| 5,533,540 | 7/1996 | Stanasolovich et al. . | |
| 5,534,076 | 7/1996 | Bran . | |
| 5,540,245 | 7/1996 | Munakata et al. . | |
| 5,581,837 | 12/1996 | Uchiyama et al. .......................... | 15/77 |
| 5,766,685 | 6/1998 | Smith .................................... | 134/64 R |

FOREIGN PATENT DOCUMENTS

WO 97/13590  4/1997  WIPO .

OTHER PUBLICATIONS

Tube Resonator System Series RG–36/RS–36, High–Tech Ultrasonic Cleaning, by Telsonic UIltrasonics, Sep. 20,1993.
Patent Abstracts of Japan, vol. 16, No. 95, Mar. 9, 1992 and JP 3–274722 (Hitachi Ltd.).
Patent Abstracts of Japan, vol. 96, No. 2, Feb. 29, 1996 and JP 7–256217 (Puretetsuku).
Patent Abstracts of Japan, vol. 97, No. 7, Jul. 31 1997 and JP 9–63998 (Sony Corp.).

*Primary Examiner*—Terrence R. Till
*Attorney, Agent, or Firm*—Snell & Wilmer, L.L.P.

[57] ABSTRACT

An improved cleaning apparatus for cleaning semiconductor wafers, rigid memory disks, flat panel displays, and other workpieces employs vibrational mechanical energy in addition to contact mechanical cleaning. The cleaning apparatus includes a cleaning element configured to contact and scrub a workpiece during a cleaning process. The cleaning clement is coupled to a mechanical energy emitter that generates low frequency mechanical vibrations (or ultrasonic mechanical energy) at a predetermined frequency. The mechanical energy is conducted through the cleaning element and to the workpiece to facilitate removal of particulate and debris from the surface of the workpiece. Use of ultrasonic energy also causes the cleaning solution to cavitate, thus providing ultrasonic cleaning to the workpiece via the cleaning solution.

28 Claims, 5 Drawing Sheets

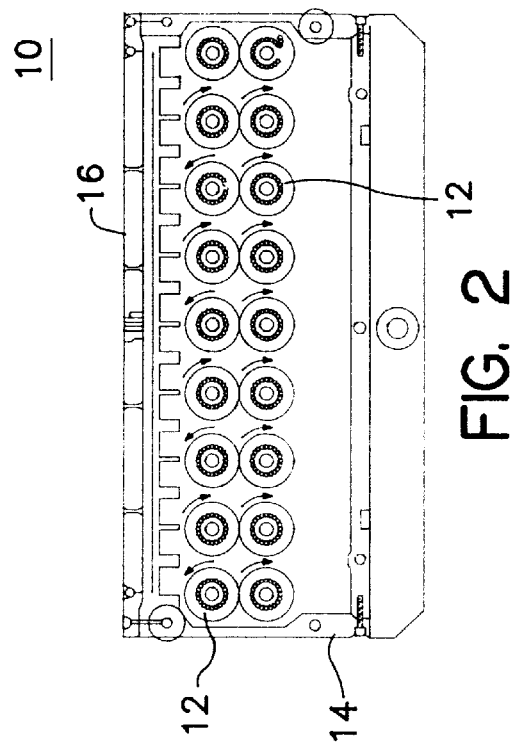
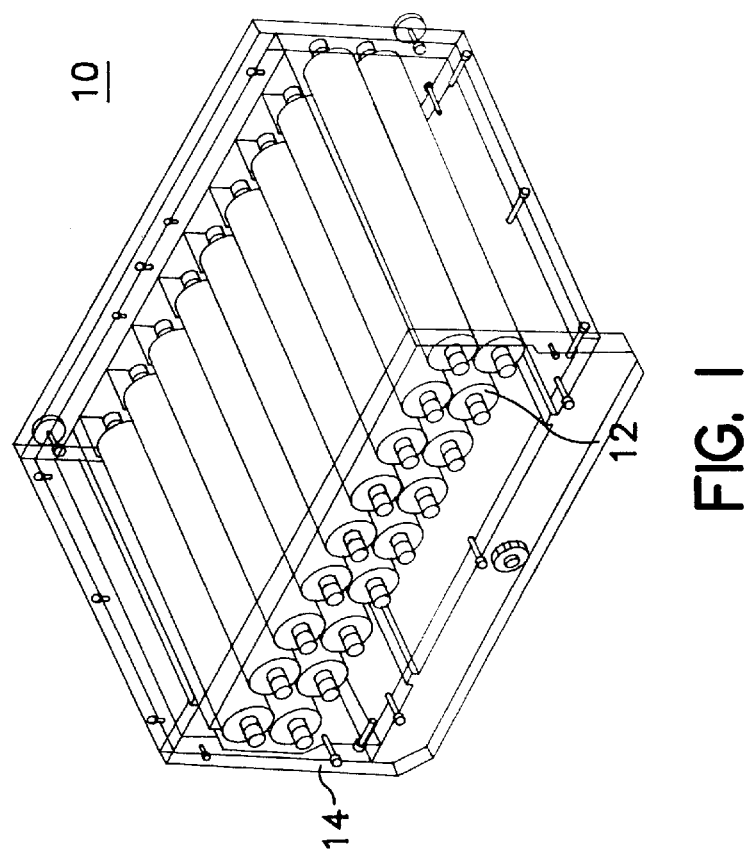

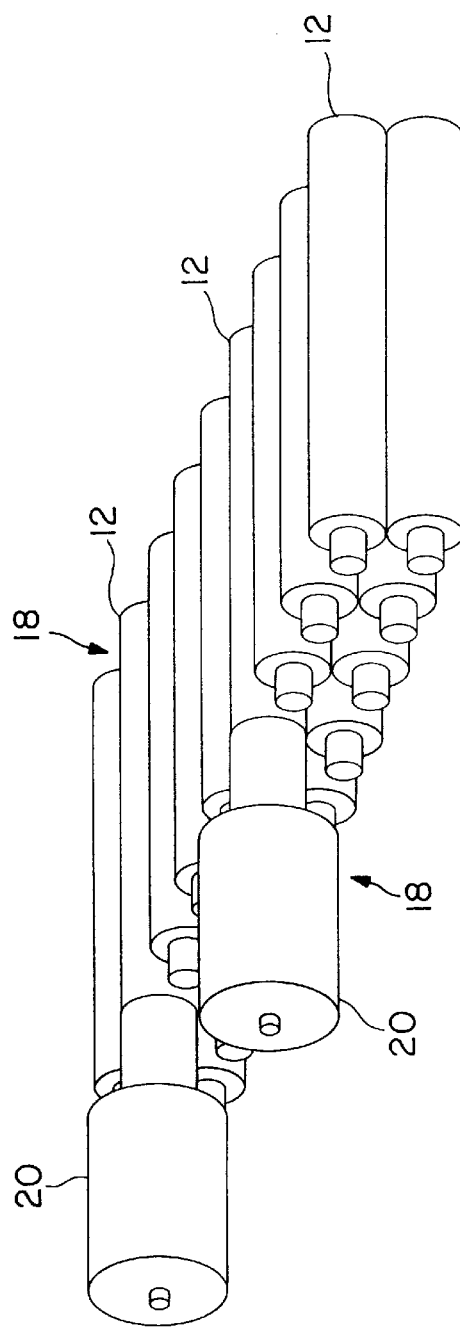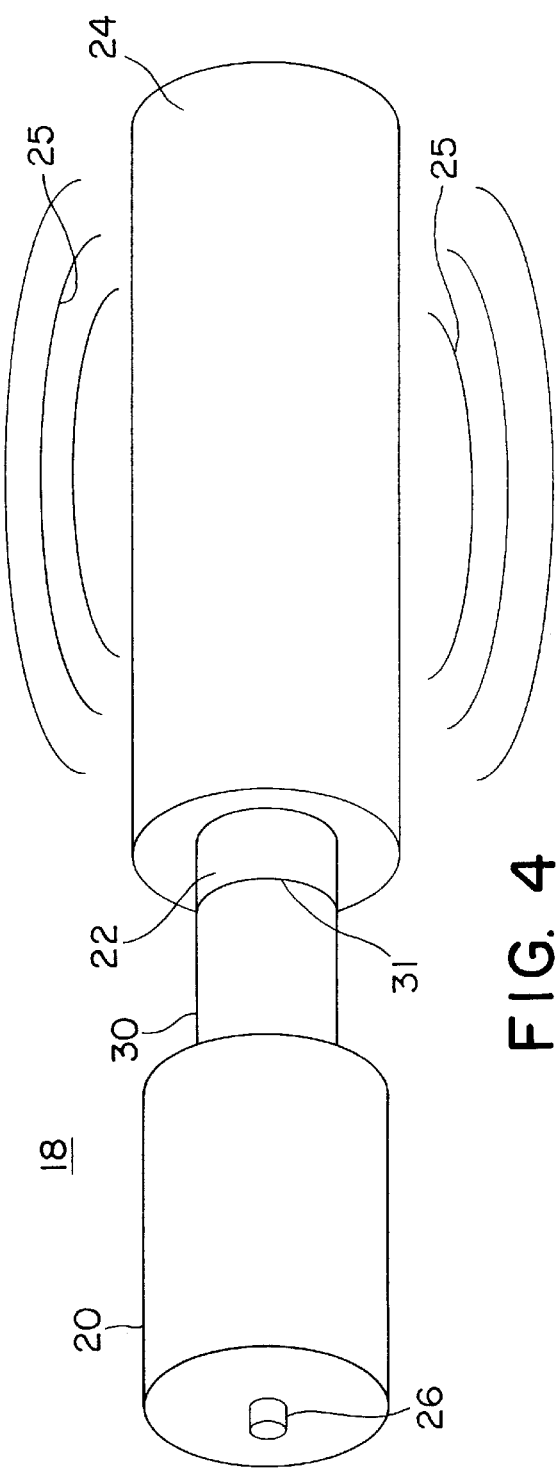

METHOD AND APPARATUS FOR ENHANCED CLEANING OF A WORKPIECE WITH MECHANICAL ENERGY

TECHNICAL FIELD OF THE INVENTION

The present invention relates generally to workpiece cleaning devices that employ vibrational mechanical energy. More specifically, the present invention relates to a device that includes a cleaning element that performs vibrational mechanical cleaning and contact cleaning of a workpiece during a cleaning procedure.

BACKGROUND OF THE INVENTION

Machines designed to clean semiconductor wafers, magnetic memory disks, and other delicate workpieces are generally well known. In the manufacture of integrated circuits, semiconductor wafer disks are sliced from a silicon ingot and thereafter prepared for further processing. After each wafer is sliced from the ingot, it is typically cleaned, rinsed, and dried to remove debris from its surfaces. Thereafter, a series of steps are performed on the wafer to build the integrated circuits upon its surface, including the application of a layer of microelectronic structures and the application of a dielectric layer.

Magnetic memory disks, flat panel displays, and other workpieces may also require cleaning or washing during processing. Accordingly, methods and apparatus for quickly and efficiently cleaning such workpieces are needed. A conventional semiconductor wafer cleaning machine utilizes several polyvinyl acetate (PVA) cleaning elements that perform mechanical contact scrubbing of the wafer surfaces during a cleaning process. Unfortunately, treatment time may be undesirably long because each wafer must pass through a number of cleaning elements in a serial manner. The use of a number of cleaning elements adds to the time and cost associated with the cleaning procedure and increases the maintenance cost associated with the cleaning equipment.

Resilient cleaning elements for semiconductor wafers, memory disk elements, flat panel displays and the like may become contaminated with debris or particulate that are liberated from the surfaces of the workpieces as they are cleaned. Such cleaning elements may become embedded with small particles that are difficult to remove by rinsing or cleaning solutions during the cleaning procedure. Accordingly, such cleaning elements must either be periodically cleaned (during downtime of the cleaning machine) or replaced to ensure that the sensitive workpieces are not damaged by such embedded debris.

Vibrational or ultrasonic cleaning tanks and associated cleaning procedures are well known. Conventional ultrasonic tanks vibrate at an ultrasonic frequency to agitate the cleaning solvent contained within the tank. The ultrasonic vibration within the solution enhances cleaning of the workpieces submerged in the solution by loosening the debris from the workpiece surface. However, while such prior art ultrasonic tanks effectively employ ultrasonic energy, they fail to take advantage of the mechanical vibrations that can otherwise be utilized to reduce the time associated with cleaning workpieces by conventional contact scrubbing or ultrasonic cleaning alone.

SUMMARY OF THE INVENTION

Accordingly, it is an advantage of the present invention that an improved apparatus for cleaning workpieces is provided.

Another advantage of the present invention is that it provides an apparatus for cleaning workpieces with vibrational mechanical energy.

A further advantage of the present invention is that conventional PVA cleaning elements may be used to provide contact cleaning in conjunction with vibrational mechanical cleaning.

Another advantage is that the present invention employs vibrational mechanical energy to reduce the cleaning time associated with conventional semiconductor wafer cleaning processes.

It is another advantage of the present invention that the use of vibrational mechanical energy facilitates removal of particulate from the cleaning elements during the cleaning, process.

The above and other advantages are carried out by an apparatus for cleaning a workpiece, where the apparatus includes a cleaning element configured to contact a workpiece during a cleaning process and a mechanical energy emitter in communication with the cleaning element. The mechanical energy emitter is configured to apply mechanical energy to the cleaning element during the cleaning process.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

FIG. 1 is a perspective view of a semiconductor wafer cleaning station within which a preferred embodiment of the present invention may be employed;

FIG. 2 is a side view of the cleaning station shown in FIG. 1;

FIG. 3 depicts a plurality of semiconductor wafer cleaning elements arranged in accordance with the present invention;

FIG. 4 depicts a semiconductor wafer cleaning element that incorporates a mechanical energy emitter;

DETAILED DESCRIPTION OF PREFERRED EXEMPLARY EMBODIMENTS

Figure 5:
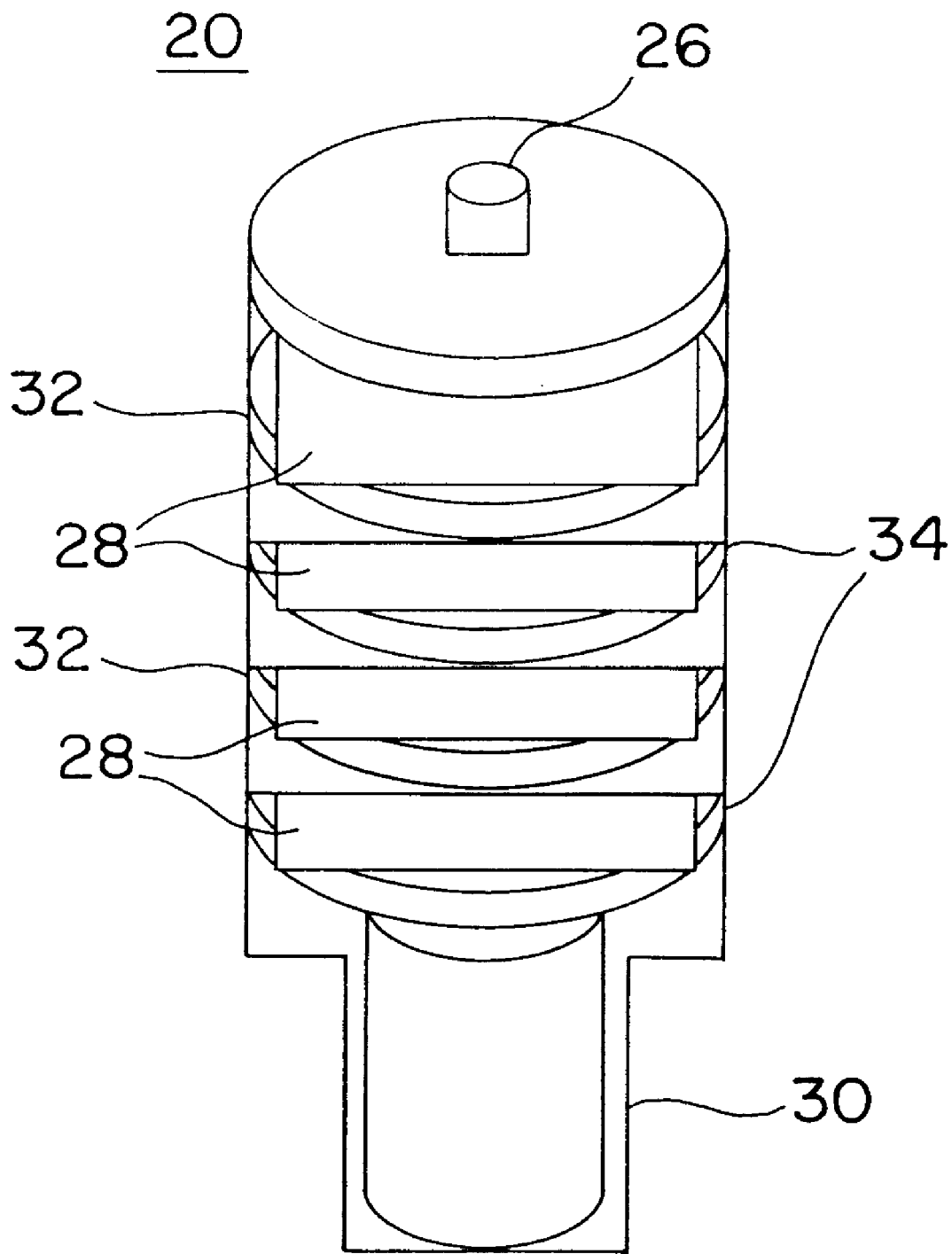
FIG. 5 is a schematic representation of an ultrasonic mechanical energy emitter.

Referring to FIGS. 1 and 2, an exemplary semiconductor wafer cleaning station 10 is illustrated. Cleaning station 10 may be incorporated within a larger machine for cleaning, rinsing, and drying semiconductor wafers (or other workpieces), e.g., as described in U.S. patent application entitled "Methods and Apparatus for Cleaning and Drying Wafers," Ser. No. 08/676.546, filed Jul. 8, 1996, the entire contents of which is incorporated by reference herein. It should be noted that the present invention may be employed in any number of workpiece processing environments for different purposes than that described herein, e.g., material removal, sterilization of equipment, and surface treatments.

Generally, cleaning station 10 suitably includes a plurality of cleaning elements (rollers) 12 configured to drive each workpiece through cleaning station 10 and to simultaneously clean the top and bottom surfaces of each workpiece passing therethrough. Rollers 12 are suitably configured to contact the workpiece during the cleaning process and to move translationally over the surface of the workpiece. Preferably, rollers 12 are substantially cylindrical in shape and are positioned within cleaning station 10 to rotate about their respective longitudinal axes. More particularly and with particular reference to FIG. 2, cleaning station 10 may include on the order of 5–15 pairs of rollers 12. In accordance with the present invention, the use of vibrational mechanical energy (described below) enables cleaning station 10 to employ fewer rollers 12 than in prior art systems. As best viewed in FIG. 2, cleaning station 10 is suitably configured such that workpieces enter from one side. e.g., the far left, are sequentially urged through the rollers 12, and are discharged from an opposite side, e.g., the far right.

In accordance with a preferred exemplary embodiment, each of the odd pairs of rollers 12 (e.g., the first, third, fifth, seventh, and ninth pairs) function as drive rollers and the even pairs of rollers 12 (e.g., the second, fourth, sixth, and eighth pairs) function as cleaning rollers. Moreover, each of the bottom rollers 12 rotate clockwise, the top roller 12 of each even pair of rollers 12 rotates clockwise, and the top roller 12 in each odd pair of rollers 12 preferably rotates counter-clockwise (with respect to the perspective shown in FIG. 2). These respective rotational directions are indicated by the directional arrows in FIG. 2.

Each roller 12 may include a gear assembly (not shown) or other arrangement suitable for imparting the desired rotational speed and direction to the roller 12. As shown in FIG. 1, rollers 12 are preferably mounted within cleaning station 10 such that they are free to rotate about their longitudinal axes. Accordingly, cleaning station 10 may incorporate bearings, sleeves seals, and conventional coupling elements to suitably position rollers 12. Such coupling elements may be selected such that rollers 12 are sufficiently damped from the vibrational mechanical energy generated by cleaning station 10 (described below).

Those skilled in the art will appreciate that the individual speeds of rollers 12 and the pressure imparted to the workpiece by rollers 12 may vary from application to application. Furthermore, it is to be understood that virtually any number of rollers 12 and any combination of roller speeds and roller directions may be employed in the context of the present invention to achieve the desired cleaning performance for the particular process.

Cleaning station 10 preferably includes a solution tank 14 configured to carry an amount of cleaning solution (not shown). For purposes of vibrational mechanical cleaning, the cleaning solution is preferably capable of conducting vibrational energy, e.g., ultrasonic energy, to the workpiece during the cleaning process. The cleaning solution may be any solution known to those skilled in the art, such is deionized water or a suitable surfactant. In a preferred embodiment, solution tank 14 and rollers 12 are configured such that at least one pair of rollers 12 is substantially immersed within the cleaning solution during the cleaning process.

Referring now to FIG. 2, a top panel 16 of cleaning station 10 may include one or more fluid inlet ports (not shown) configured to distribute fluid to a discrete portion of or to the entirety of the inside of solution tank 14. It should be noted that the present invention may alternatively employ a cleaning solution spray or trickle applicator configured to deposit the cleaning solution directly onto rollers 12. Of course, it is to be appreciated that any number of fluid inlet ports may be employed in conjunction with cleaning station 10, and that the fluid inlet ports may communicate with any desired portion of solution tank 14, with or without overlap, as desired to optimize particular processing applications.

Cleaning station 10 may also include a fluid outlet (not shown) through which the cleaning fluid may flow during or after the cleaning procedure. If desired, the cleaning solution retrieved from the fluid outlet may be recycled, disposed of, or handled as desired.

FIG. 3 is a schematic representation of rollers 12 arranged in accordance with the present invention, i.e., at least one roller assembly 18 includes a roller 12 and a mechanical energy emitter 20 coupled thereto. Those skilled in the art should appreciate that, although FIG. 3 shows only two mechanical energy emitters 20, any number of emitters 20 may be used in conjunction with any number of rollers 12. Furthermore, emitters 20 need not be coupled to specific rollers 12, e.g., emitters 20 may be coupled to upper or lower rollers, to drive rollers, or to cleaning rollers (described above). Emitters 20 may be located within solution tank 14 or, preferably, external to solution tank 14. External mounting protects emitters 20 and the associated electronic wiring from contamination by the cleaning solutions.

In accordance with the present invention, mechanical energy emitter 20 may be configured to generate relatively low frequency vibrational energy or relatively high frequency ultrasonic energy, depending upon the specific application. For example, emitter 20 may be realized by a magnetic resonator, a pneumatic transducer, or any other device suitable for producing mechanical vibrations at a desirable amplitude. Relatively low frequency mechanical vibrations may be desirable in certain applications where intense ultrasonic cavitation and cleaning is not required. The mechanical vibrations generated by emitter 20 may exhibit subsonic frequencies, e.g., between approximately 5 Hz and approximately 20 Hz, audible frequencies between 20 Hz and 20 kHz, or any other suitable frequency range.

With reference now to FIG. 4, roller assembly 18 incorporating emitter 20 will be described in detail. For purposes of this description, emitter 20 is configured as an ultrasonic emitter. However, as described above, the present invention may be alternately configured with a vibrational mechanical emitter. Accordingly, the following description is applicable to an alternate embodiment that utilizes low frequency vibrational mechanical energy rather than ultrasonic energy.

Roller assembly 18 generally includes emitter 20, a substantially rigid core 22, and a cleaning material 24. Ultrasonic emitter 20 suitably produces ultrasonic mechanical energy that is directed to and conducted by core 22. In turn, the ultrasonic mechanical energy is transmitted from core 22 to cleaning material 24, which contacts the workpiece during the cleaning procedure. Cleaning material 24 may also radiate an amount of ultrasonic energy 25 to the surrounding environment, e.g., the cleaning solution bath. The ultrasonic mechanical energy causes cleaning material 24 to vibrate or oscillate at an ultrasonic frequency, thus enhancing the contact cleaning of the workpiece. In addition, the ultrasonic energy causes cavitation of the molecules of the cleaning solution, which liberates particulate and debris from the surface of the workpiece in a conventional manner. Furthermore the ultrasonic energy produced by ultrasonic emitter 20 suitably facilitates removal of loose debris from cleaning material 24; the removed debris can then be effectively washed away by the cleaning solution.

FIG. 5 is a schematic representation of ultrasonic emitter 20. Ultrasonic emitter 20 preferably includes an RF connector 26, a number of piezoelectric transducers 28, and a front driver 30. Transducers 28 are preferably sandwiched in a stack arrangement between positive RF, electrodes 32 and negative RF electrodes 34. RF connector 26 is configured as a rotating component that enables roller assembly 18 to freely rotate about its longitudinal axis without twisting or binding the electrical conductor (not shown) that is coupled to RF connector 26 during use. Rotating couplers and electrical connectors suitable for use as RF connector 26 are known to those skilled in the art and need not be described in detail herein. In an alternate preferred embodiment (described in detail below), emitter 20, core 22, and front driver 30 remain substantially stationary while cleaning material 24 is caused to rotate independently around core 22. Such an embodiment may eliminate the need for rotational couplers, joints, and seals that may otherwise be susceptible to failure or deterioration after a period of use. Furthermore, the presence of additional couplers, joints, or seals may degrade the quality of ultrasonic transmission from ultrasonic emitter 20 to cleaning material 24.

An RF excitation signal is preferably applied to RF connector 26 during the cleaning process. Any suitable RF generator (not shown) known to those skilled in the art may be employed to produce the excitation signal. In one exemplary embodiment, the excitation signal has a frequency within the range of approximately 30 kHz to 50 kHz. Of course, the present invention may utilize an excitation signal having any ultrasonic frequency (or an audible or subsonic mechanical vibrational frequency) and any suitable amplitude; the specific operating frequency may vary from application to application. In response to the excitation signal, the crystals within transducers 28 expand and contract (vibrate). Ultrasonic emitter 20, or portions thereof, may be commercially available from several sources such as Branson Ultrasonic, Forward Technologies, and Telsonic Ultrasonic.

It should be appreciated that ultrasonic emitter 20 may alternatively employ any suitable element configured to transform the excitation signal into ultrasonic mechanical energy. For example, the present invention may alternatively include electromagnetic transducers capable of producing a suitable ultrasonic signal. As described briefly above, the present invention may utilize a number of devices to produce a suitable vibrational mechanical signal, e.g., piston vibrators, ball vibrators, pneumatic vibrators, electromechanical vibrators, or electromagnetic vibrators.

Although not shown, ultrasonic emitter 20 may include a booster or other signal conditioning, element configured to adjust the amplitude and/or other characteristics of the vibrations generated by transducers 28. Front driver 30 is configured to direct the ultrasonic mechanical energy to roller assembly 18. In accordance with conventional ultrasonic components, front driver 30 is preferably tuned to the particular frequency with which ultrasonic emitter 20 is designed to produce.

Front driver 30 is configured to couple to roller 12 such that the ultrasonic mechanical energy is transferred from ultrasonic emitter 20 to roller 12. Referring back to FIGS. 3 and 4, core 22 is preferably coupled to front driver 30 via a threaded coupling. This coupling is identified by reference numeral 31 in FIG. 4. However, any suitable coupling mechanism may be employed to facilitate efficient transfer of the ultrasonic energy from front driver 30 to core 22. Core 22 is formed from a material suitable for the conduction of ultrasonic mechanical energy, e.g., steel. Core 22 is approximately tuned to the operating frequency of ultrasonic emitter 20 to facilitate efficient conduction of the ultrasonic energy. It should be appreciated that the tuning process may be equivalently applied to alternate embodiments that utilize lower frequency vibrational energy emitters rather than ultrasonic emitters.

In the exemplary embodiment shown in FIGS. 3 and 4, cleaning material 24 substantially surrounds core 22 such that a seamless cleaning surface is provided. Cleaning material 24 is relatively soft and resilient in comparison to core 22. Accordingly, core 22 may include structures (not shown) or any suitable mechanism to facilitate a strong frictional fit between core 22 and cleaning material 24. In this way, slippage between core 22 and cleaning material 24 may be minimized, while at the same time facilitating the easy removal and reinsertion of cleaning material 24 off of and onto core 22. In this regard, cleaning material 24 may be formed from PVA; such PVA rollers are currently available from the Meracel Company of N.J.

Figure 7:
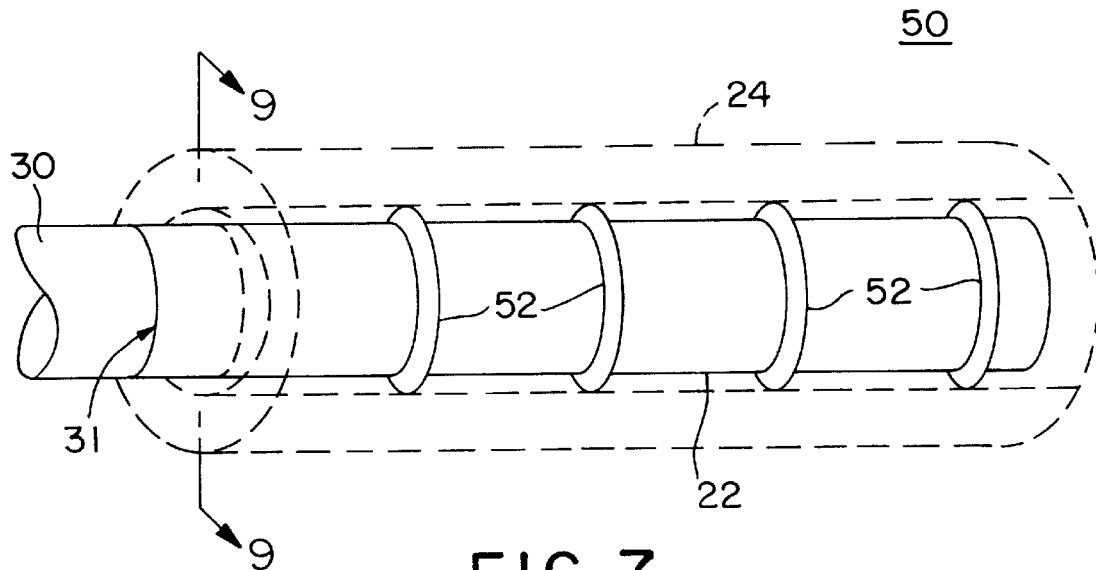
FIG. 7 is a perspective view of a cleaning element in accordance with an alternate embodiment of the present invention.
Figure 8:
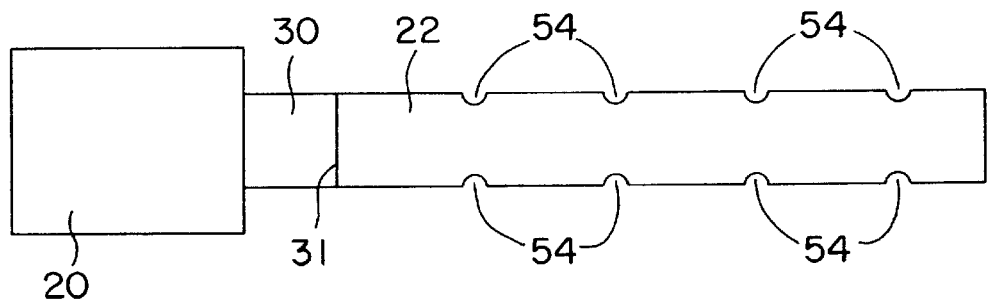
FIG. 8 is a side view of a core that may be used with the cleaning element shown in FIG. 7.
Figure 9:
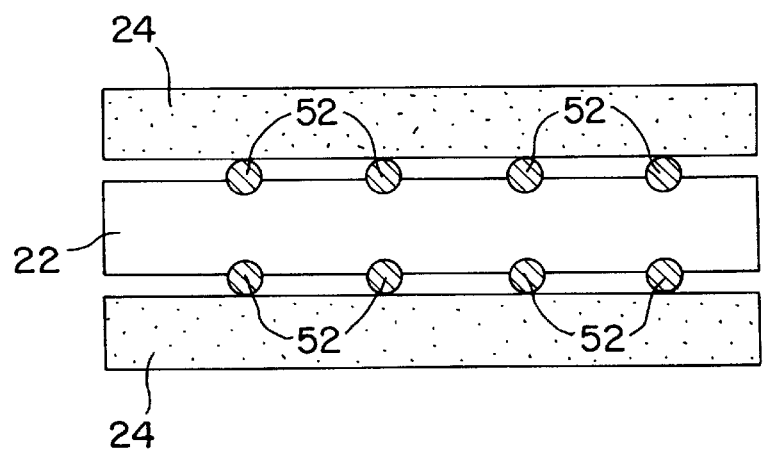
FIG. 9 is a sectional view of the cleaning element shown in FIG. 7, as viewed along line 9—9.

FIGS. 7–9 depict a cleaning element 50 configured in accordance with an alternate preferred embodiment of the present invention. As described above, cleaning element 50 may be configured for use with either an ultrasonic emitter or a vibrational mechanical emitter; the following description is not limited to either embodiment. Cleaning element 50 may be employed when it is desirable to maintain ultrasonic emitter 20, front driver 30, and/or core 22 in a substantially stationary position. For example, rotation of cleaning element 24 along with core 22 may be difficult or cumbersome to accomplish, especially when rotational RF couplers, seals, and other components are included in the assembly. Furthermore, the use of attachment members, e.g., keys and keyways, may interfere with the tuning of core 22 and such members (and other components) may otherwise reduce the effectiveness of cleaning element 50. Accordingly, cleaning element 50 is preferably configured to enable cleaning material 24 to independently rotate around core 22.

In the alternate embodiment depicted in FIGS. 7–9, cleaning element 50 generally includes core 22, a plurality of mounting rings 52, and cleaning material 24. Core 22 is coupled to, and cooperates with, ultrasonic emitter 20 via front driver 30 (as described above). As shown in FIG. 8, core 22 may be substantially cylindrical in shape and core 22 preferably includes a plurality of annular channels 54 formed therein. Although channels 54 are depicted as having a substantially round cross section, channels 54 may be suitably shaped as necessary for the specific application. Channels 54 are preferably positioned at nodal points located along the length of core 22. In the context of this description, nodal points are those points along core 22 that transmit a substantially reduced amount of mechanical energy relative to other points located on core 22. In other words, the amount of mechanical energy measured along the length of core 22 may vary in a substantially cyclical manner; in an ideal situation, the amount of energy is minimized at the nodal points.

The locations of the nodal points may be determined empirically or theoretically in accordance with known techniques. The spacing of the nodal points and, consequently, channels 54, is associated with the tuning of core 22 and the operating frequency of ultrasonic emitter 20. Accordingly, the specific location of the nodal points may be associated with the predetermined frequency of ultrasonic energy emitter 20. the specific material from which core 22 is formed (e.g., stainless steel, aluminum, or the like), or the dimensions of core 22.

Mounting rings 52, or some other suitable coupling components, enable cleaning material 24 to communicate with core 22. Mounting rings 52 are suitably sized such that they may be received within annular channels 54 and such that at least a portion of each mounting ring 52 contacts core 22 to enable transmission of ultrasonic mechanical energy from core 22 to cleaning material 24. Mounting rings 52 may also be configured to substantially prevent contact between cleaning material 24 and core 22 (see FIG. 9). Such spacing may extend the lifespan of cleaning material 24 and facilitate effective rinsing of cleaning material 24 during use. It should be appreciated that cleaning material 24 may be suitably coupled to mounting rings 52 in accordance with various known techniques. Alternatively, mounting rings 52 may be integrally formed within cleaning material 24. In the preferred embodiment, mounting rings 52 are formed from a rigid plastic resin or stainless steel, which facilitates adequate transmission of ultrasonic energy and provides sufficient structural integrity for cleaning element 50.

When received within channels 54, mounting rings 52 are capable of rotation around core 22. Consequently, cleaning material 24 may rotate independently from core 22, emitter 20, and front driver 30. Cleaning station 10 may include any suitable drive mechanism (not shown) coupled to mounting rings 52 and/or cleaning material 24 to cause rotation of cleaning material relative to core 22.

In contrast to conventional cleaning tanks that merely introduce mechanical energy into a reservoir of solvent, the preferred embodiments of the present invention apply mechanical energy directly to a cleaning element, e.g., roller assembly 18. Thus, the cleaning element performs contact surface cleaning in a translational mode while performing vibrational or ultrasonic cleaning in a random or oscillating manner. The additional cleaning effect caused by the mechanical energy allows cleaning station 10 to effectively clean workpieces in a reduced amount of time and/or with a fewer number of cleaning elements.

Figure 6:
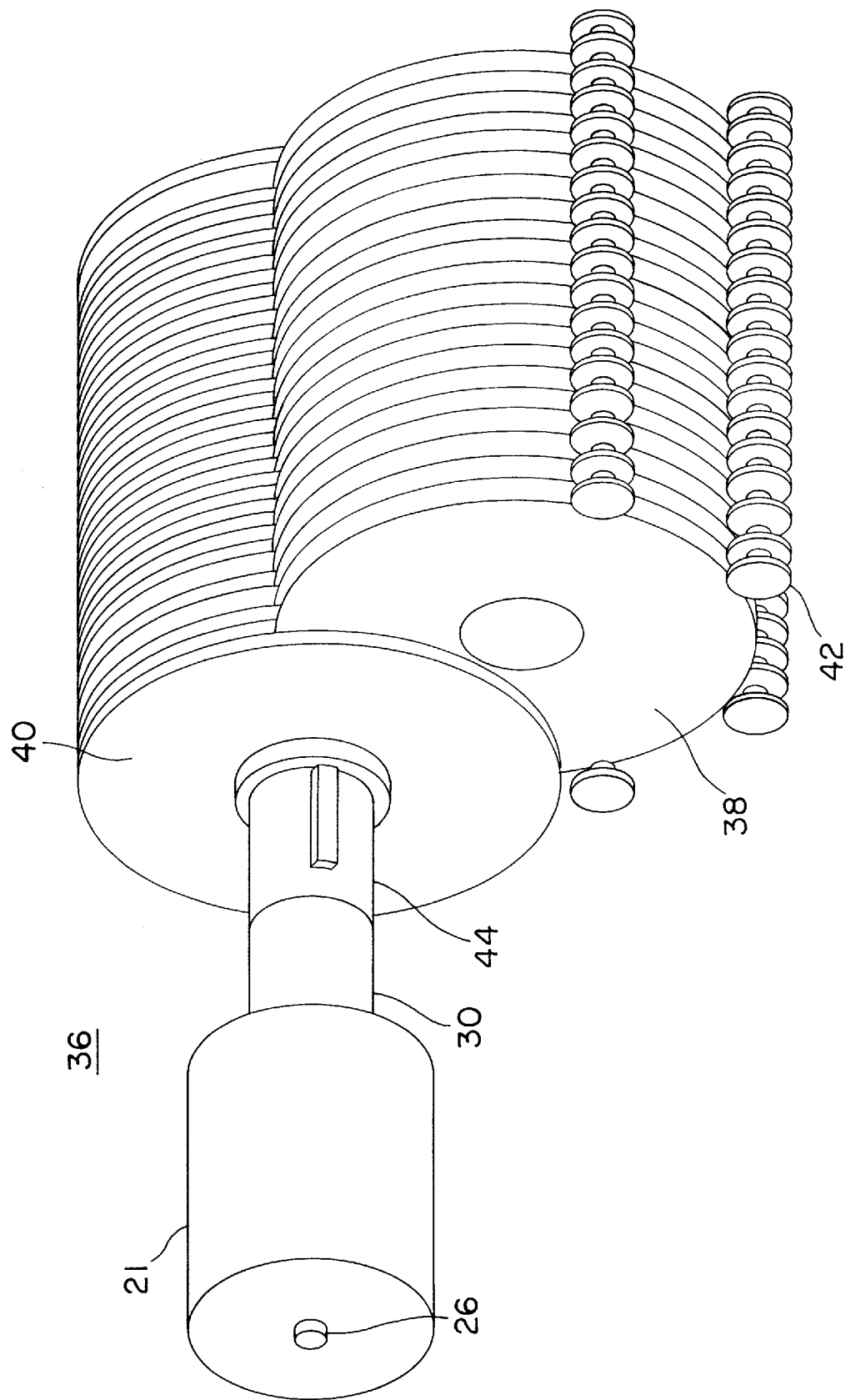
FIG. 6 is a perspective view of a memory disk cleaning station that incorporates an alternate embodiment of the present invention.

FIG. 6 illustrates an alternate cleaning station 36 configured to clean rigid memory disks 38. In this embodiment, a number of cleaning elements 40 are arranged to clean at least one memory disk 38. Memory disks 38 are preferably supported by a plurality of carrier rollers 42 that allow or cause memory disks 38 to rotate during cleaning. Cleaning elements 40 are coupled to a rotating( shaft 44 in a substantially evenly spaced manner to facilitate contact cleaning of memory disks 38 by cleaning elements 40. Each cleaning element 40 may include a PVA outer surface supported by a substantially rigid core (not shown). In the exemplary embodiment, the rigid core of each cleaning element 40 is coupled to shaft 44 to provide a suitable conduction path for vibrational mechanical energy.

The inventor has discovered that the application of ultrasonic energy may be too rigorous for the delicate structure of cleaning elements 40. Accordingly, cleaning station 36 may incorporate a vibrational emitter 21 rather than ultrasonic emitter 20. In particular emitter 21 may be suitably coupled to shaft 44 such that vibrational mechanical energy at a predetermined frequency is transmitted to shaft 44. As described briefly above, such vibrational mechanical energy may be emitted at a subsonic or audible frequency, as desired for the particular application. As with core 22 (described above in connection with cleaning station 10), shaft 44 is preferably tuned in accordance with the predetermined frequency associated with emitter 20. The amplitude of the mechanical energy is such that the energy is conducted through shaft 44, through cleaning elements 40, and to the respective memory disks 38. (Consequently, memory disks 38 can be subjected to both mechanical contact scrubbing and vibrational mechanical cleaning as cleaning elements 40 and memory disks 38 rotate relative to each other.

It should be appreciated that, like cleaning element 50, cleaning station 36 may employ offset elements (not shown) that are indirectly coupled to shaft 44 via mounting rings or other components. Such an arrangement preferably enables rotation of the cleaning elements about shaft 44, which may be held stationary.

In summary, the present invention provides improved apparatus for cleaning workpieces with mechanical energy; such mechanical energy may be relatively low frequency vibrational energy or relatively high frequency ultrasonic energy. A cleaning station may employ cleaning elements to provide contact cleaning in conjunction with such mechanical cleaning. The use of mechanical energy reduces the cleaning time associated with conventional semiconductor wafer cleaning processes and facilitates removal of particulate from the cleaning elements during the cleaning process.

The present invention has been described above with reference to preferred exemplary embodiments. However, those skilled in the art will recognize that changes and modifications may be made to the preferred embodiments without departing from the scope of the present invention. For example, the materials used for the various components are not limited to those described or shown. In addition, the configuration of the cleaning stations may be modified for compatibility with the particular workpiece being cleaned. These and other changes or modifications are intended to be included within the scope of the present invention, as expressed in the following claims.

What is claimed is:

1. An apparatus for cleaning a workpiece, said apparatus comprising:

a cleaning element configured to contact said workpiece during a cleaning process wherein said cleaning element comprises a substantially rigid core configured to conduct mechanical energy and a cleaning material coupled to said core, said cleaning material contacting said workpiece during said cleaning process; and a mechanical energy emitter in communication with said cleaning element, said mechanical energy emitter being configured to apply mechanical energy to said cleaning element during said cleaning process, said mechanical energy emitter comprising means for transforming an excitation signal into ultrasonic mechanical energy, and means for directing said ultrasonic mechanical energy to said cleaning element.

2. An apparatus according to claim 1, wherein said cleaning material substantially surrounds said core.

3. An apparatus according to claim 1, wherein said core contacts a portion of said mechanical energy emitter such that mechanical energy is transmitted from said mechanical energy emitter to said cleaning element.

4. An apparatus according to claim 1, wherein said core is formed from material suitable for mechanical energy conduction.

5. An apparatus according to claim 1, wherein said cleaning material is coupled to said core via a mounting element, said mounting element being configured to contact said core and to substantially prevent contact between said cleaning material and said core.

6. An apparatus according to claim 5, wherein:

said core includes a nodal point located thereon, said nodal point transmitting a substantially reduced amount of mechanical energy relative to other points located on said core; and said mounting element contacts said core approximately at said nodal point.

7. An apparatus according to claim 1, wherein said means for directing comprises an ultrasonic horn configured to couple to said cleaning element.

8. An apparatus according to claim 1, wherein said mechanical energy emitter causes said cleaning element to mechanically vibrate during said cleaning process.

9. An apparatus according to claim 1, further comprising means for applying a cleaning solution to said cleaning element during said cleaning process.

10. An apparatus for cleaning a workpiece, said apparatus comprising:

a cleaning element configured to contact and mechanically clean said workpiece during a cleaning process, said cleaning element comprising a substantially rigid core; and means for applying mechanical energy at a predetermined frequency to said core during said cleaning process, said predetermined frequency being within a range of approximately 30 kHz to 50 kHz.; wherein:

said core is tuned to facilitate conduction of mechanical energy at said predetermined frequency;

said cleaning element is substantially cylindrical in shape;

said cleaning element is configured to rotate about its longitudinal axis during said cleaning process; and said means for applying mechanical energy causes said cleaning element to mechanically vibrate at approximately said predetermined frequency during said cleaning, process.

11. An apparatus according to claim 10, further comprising a solution tank in which said cleaning element is substantially immersed in a cleaning solution during said cleaning process, wherein said means for applying mechanical energy is further configured to apply mechanical energy to said cleaning solution during said cleaning process.

12. An apparatus according to claim 10, wherein said cleaning element further comprises a cleaning material coupled to said core, said cleaning material contacting said workpiece during said cleaning process.

13. An apparatus according to claim 12, wherein:

said core includes a nodal point located thereon, said nodal point transmitting a substantially reduced amount of mechanical energy relative to other points located on said core; and said cleaning material is coupled to said core via a mounting element located approximately at said nodal point.

14. An apparatus according to claim 13, wherein the location of said nodal point upon said core is associated with at least one of said predetermined frequency, a material from which said core is formed, and the dimensions of said core.

15. An apparatus according to claim 13, wherein:

said core is substantially cylindrical in shape and comprises an annular channel formed therein at said nodal point;

said mounting element is substantially ring-shaped and is received within said annular channel; and said mounting element is capable of rotation around said core.

16. An apparatus according to claim 12, wherein said cleaning material substantially surrounds said core.

17. An apparatus according to claim 10, wherein said means for applying mechanical energy is coupled to said core.

18. An apparatus according to claim 17, wherein said means for applying mechanical energy comprises an ultrasonic emitter.

19. A method for cleaning workpieces, said method comprising the steps of:

providing a cleaning element configured to contact a workpiece, wherein said cleaning element is substantially cylindrical in shape;

translationally moving said cleaning element relative to said workpiece to thereby perform mechanical cleaning of said workpiece by rotating said cleaning element about its longitudinal axis; and applying vibrational energy to said cleaning element during said moving step to thereby perform vibrational mechanical cleaning of said workpiece, wherein said applying step causes said cleaning element to vibrate at an ultrasonic frequency.

20. A method according to claim 19 wherein:

said cleaning element comprises a substantially rigid core configured to conduct ultrasonic mechanical energy; and said method further comprises the step of tuning said core to facilitate conduction of ultrasonic mechanical energy at said ultrasonic frequency.

21. A method according to claim 19, further comprising the steps of:

substantially immersing said cleaning element in a cleaning solution; and applying vibrational energy to said cleaning solution during said moving step to thereby perform vibrational mechanical cleaning of said workpiece.

22. A method according to claim 19, wherein said applying step is performed by a mechanical energy emitter configured to communicate mechanical energy to said cleaning element.

23. A method according to claim 19, wherein said applying step comprises the steps of:

transforming an excitation signal into vibrational energy; and directing said vibrational energy to said cleaning element.

24. A method for cleaning workpieces, said method comprising the steps of:

providing a cleaning element configured to contact a workpiece;

dispensing a cleaning solution onto said cleaning element;

translationally moving said cleaning element relative to said workpiece to thereby perform mechanical cleaning of said workpiece, said moving step being performed after said dispensing step; and applying vibrational energy to said cleaning element during said moving step to thereby perform vibrational mechanical cleaning of said workpiece, said applying step causing said cleaning element to vibrate at an ultrasonic frequency.

25. A method according to claim 24, wherein:

said cleaning element comprises a substantially rigid core configured to conduct ultrasonic mechanical energy; and said method further comprises the step of tuning said core to facilitate conduction of ultrasonic mechanical energy at said ultrasonic frequency.

26. A method according to claim 24, further comprising the steps of:
   substantially immersing said cleaning element in a cleaning solution; and
   applying vibrational energy to said cleaning solution during said moving step to thereby perform vibrational mechanical cleaning of said workpiece.

27. A method according to claim 24, wherein said applying step is performed by a mechanical energy emitter configured to communicate mechanical energy to said cleaning element.

28. A method according to claim 24, wherein said applying step comprises the steps of:
   transforming an excitation signal into vibrational energy; and
   directing said vibrational energy to said cleaning element.

* * * * *